United States Patent [19]

Nguyen et al.

[11] Patent Number: 5,721,161
[45] Date of Patent: Feb. 24, 1998

[54] METHOD OF MAKING HIGH-SPEED, LOW-NOISE MILLIMETERWAVE HEMT AND PSEUDORMORPHIC HEMT

[75] Inventors: Chanh Nguyen; Takyiu Liu, both of Newbury Park; Mehran Matloubian, Encino, all of Calif.

[73] Assignee: Hughes Aircraft Company, Los Angeles, Calif.

[21] Appl. No.: 555,442

[22] Filed: Nov. 9, 1995

Related U.S. Application Data

[62] Division of Ser. No. 466,156, Jun. 6, 1995, Pat. No. 5,548,140.

[51] Int. Cl.$^6$ .................................................. H01L 21/00
[52] U.S. Cl. ............................................. 438/47; 438/172
[58] Field of Search ................................. 438/46, 47, 93, 438/94, 167, 172

[56] References Cited

U.S. PATENT DOCUMENTS 4,944,811  7/1990  Sukegawa et al. ....................... 438/47
5,037,776  8/1991  Galeuchet et al. ...................... 438/172
5,358,897  10/1994  Valster et al. ......................... 438/47

OTHER PUBLICATIONS

C.G. Van de Walle, "Band Lineups and Deformation Potentials In the Model–Solid Theory", Phys. Rev. B., vol. 39, pp. 1871–1881, Jan. 1989.

*Primary Examiner*—Chandra Chaudhari
*Attorney, Agent, or Firm*—V. D. Duraiswamy; W. K. Denson-Low

[57] ABSTRACT

An epitaxial structure and method of manufacture for a field-effect transistor capable of high-speed low-noise microwave, submillimeterwave and millimeterwave applications. Preferably, the epitaxial structure includes a donor layer and/or buffer layer made from a semiconductor material having the formula $AlP_{0.39+y}Sb_{0.61-y}$.

15 Claims, 1 Drawing Sheet

METHOD OF MAKING HIGH-SPEED, LOW-NOISE MILLIMETERWAVE HEMT AND PSEUDORMORPHIC HEMT

This is a division of application Ser. No. 08/466,156 filed Jun. 6, 1995, now U.S. Pat. No. 5,548,140.

BACKGROUND OF THE INVENTION

1. Field of the Invention

The present invention relates in general to the art of electronic transistors and more specifically, to a novel material system and epitaxial structure for a modulation-doped field-effect transistor (MODFET) or lattice-matched and pseudomorphic high electron mobility transistors (HEMTs and pHEMTs).

2. Description of Related Art

A MODFET is a field-effect semiconductor transistor designed to allow electron flow to occur in an undoped channel layer so that the electron mobility is not limited by impurity scattering. MODFETs are used in a variety of electronic devices such as solid-state power amplifiers, low-noise amplifiers as well as satellite receivers and transmitters, advanced radar and fiber-optics operating in microwave, submillimeterwave and millimeterwave systems.

A conventional device includes a indium phosphide (InP) substrate; a buffer layer; a quantum well having a first quantum well barrier layer, a channel layer, a second quantum well barrier layer; a donor layer; and a barrier layer (also known as a Schottky layer). The two quantum well barrier layers are typically formed of a wide-bandgap semiconductor material such as aluminum antimonide (AlSb) or aluminum indium arsenide (AlInAs). The channel layer in the quantum well is formed of a narrow-bandgap semiconductor material such as gallium indium arsenide (GaInAs) or indium arsenide (InAs). The donor layer and the barrier layer are typically formed of a wide-bandgap material such as AlInAs, AlSb or gallium antimonide (GaSb). The barrier layer may be doped to function as both the Schottky barrier layer as well as the donor layer, so that the epitaxial structure does not contain a separate donor layer.

A lattice-matched high electron mobility transistor (HEMT) is a type of MODFET, where a narrow-bandgap semiconductor material is lattice-matched to the wide-bandgap semiconductor material. A pseudomorphic high electron mobility transistor (pHEMT) is another type of MODFET where the narrow-bandgap semiconductor material is strained in relation to the wide-bandgap semiconductor material.

In these devices, a discontinuity in the energy gaps between the two wide-bandgap semiconductor epilayers layer and the narrow-bandgap semiconductor channel layer causes electrons to remain in the channel layer. Conduction of electrons therefore takes place in an undoped channel layer so that the electron mobility is not limited by impurity scattering.

For high-speed and low-noise microwave, submillimeterwave and millimeterwave applications, manufacturers have been concentrating on providing HEMTs having a gallium indium arsenide ($Ga_{1-x}In_xAs$) channel with high In content because higher electron mobility may be achieved by increasing the In mole fraction. One type of state-of-the-art HEMT contains a binary channel wherein x=1 in the formula $Ga_{1-x}In_xAs$. It is obvious that, with the high electron mobilities of InAs (values as high as 32,000 $cm^2$-s at room temperature have been demonstrated), a binary InAs channel would result in the fastest semiconductor device, provided that one has a suitable material to form the Schottky for the InAs channel. One possible candidate for incorporating the InAs channel is to use AlSb as the two epilayers. However, among other technical problems, AlSb is chemically unstable. It would therefore be desirable to find a chemically more inert material than AlSb as the barrier layer.

Another conventional high-speed, low-noise HEMT structure has a tertiary channel based on the AlInAs/GaInAs material system grown lattice-matched to the InP substrates. To improve the speed and low-noise operation of such a device, one can incorporate more In to the GaInAs channel (with a formula of $Ga_{0.47}In_{0.53}As$ if lattice-matched to the InP substrate). It is also known in the art that incorporating a greater proportion of In in the $Ga_{1-x}In_xAs$ channel layer improves the performance of the device. However, the amount of In that can be added to the channel layer is limited because an increased proportion of In causes a lattice strain buildup in the channel layer. Although the strain buildup of the channel layer can be compensated, it is difficult to use AlInAs as a strain-compensating layer because increasing the amount of Al to shrink the lattice constant of this material increases the chemical reactivity of the AlInAs and thereby makes the device unreliable. In addition, because AlSb is a binary material, it cannot be used to shrink the lattice constant.

In addition, it is desirable to manufacture a channel with a large sheet charge density in order to obtain a device with higher current-carrying capabilities. Increasing the conduction band discontinuity ($\Delta Ec$) between the donor layer and the channel layer increases the sheet charge concentration in the channel layer. Furthermore, a wide bandgap, large Schottky material is desirable in order to improve the breakdown and leakage characteristics of the device. Moreover, a high-resistivity, wide bandgap material will be needed in order to improve the turn-off characteristics of the device.

SUMMARY OF THE INVENTION

The present invention provides a material system and epitaxial structure for a field-effect transistor that allows it to incorporate $AlP_{0.39-y}Sb_{0.61+y}$ in the barrier and/or buffer layers, thereby allowing the field-effect transistor to provide both low-noise and high-speed capabilities.

In accordance with a preferred embodiment of the present invention, the novel material system, which results in a field-effect transistor on a semiconductive support made from an InP substrate, includes a quantum well and a barrier layer comprising $AlP_{0.39-y}Sb_{0.69+y}$. Preferably, the epitaxial structure includes buffer, donor and barrier layers comprising $AlP_{0.39-y}Sb_{0.61+y}$ and quantum well having a channel made of $Ga_{0.47-x}In_{0.53+x}As$.

The present invention also encompasses a novel method of making a material system for a field-effect transistor. The method steps include providing a quantum well over a semiconductive support and providing a barrier layer made from $AlP_{0.39+y}Sb_{0.61-y}$. Preferably, a donor layer is provided between the barrier layer and the channel layer, the donor layer is preferably made from doped $AlP_{0.39+y}Sb_{0.61-y}$ and the barrier layer remaining undoped. More preferably, a buffer layer made of $AlP_{0.39+y}Sb_{0.61-y}$ is provided between the quantum well and the seminconductive support and a channel made of $Ga_{0.47-x}In_{0.53+x}As$ is provided in the quantum well.

The epitaxial structure of the present invention results in a reliable device suitable for high-speed, low-noise applications because the large ΔEc between AlPSb and GaInAs translates into a larger sheet charge in the GaInAs channel. In addition, the device provides a flexible framework for improving the transport and breakdown/leakage characteristics and at the same time satisfying the growth requirement of a pseudomorphic structure. The high In mole fraction $Ga_{0.470-x}In_{0.53+x}As$ channel results in a high mobility and low-noise HEMT. Furthermore, the wide bandgap of the $AlP_{0.39+y}Sb_{0.61-y}$ results in a large Schottky barrier. Moreover, because AlP is a more chemically stable material than AlSb, the material $AlP_{0.39+y}Sb_{0.61-y}$ is expected to be chemically very stable compared to AlSb itself. Finally, with the large bandgap, $AlP_{0.39}Sb_{0.61}$ is an excellent candidate for a high-resistivity buffer layer.

The invention itself, together with further objects and attendant advantages, will best be understood by reference to the following detailed description, taken in conjunction with the accompanying drawings.

DESCRIPTION OF THE PREFERRED EMBODIMENTS

The present invention relates to a novel material system and epitaxial structure for a high-speed and low-noise HEMT or pHEMT particularly useful for microwave, sub-millimeterwave and millimeterwave applications.

Figure 1:
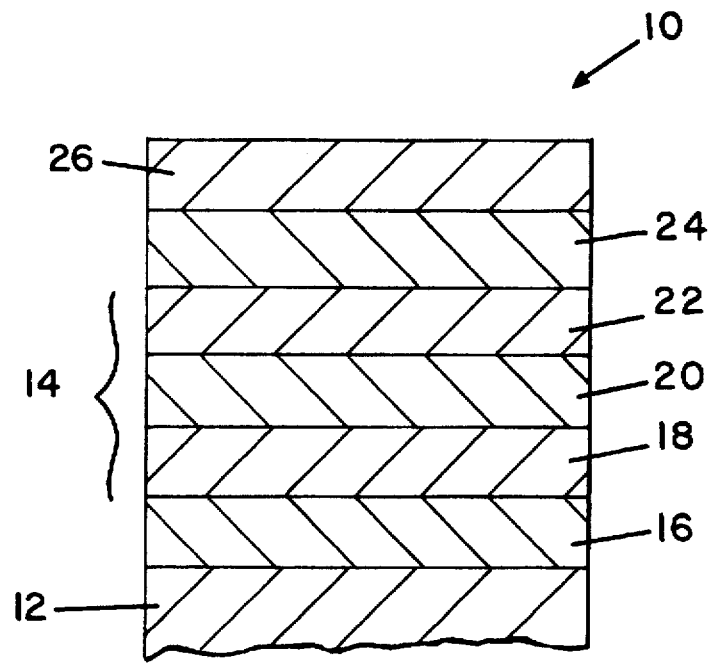
FIG. 1 is a schematic diagram of a cross-section of a field-effect transistor structure embodying the present invention.

As shown in FIG. 1, an epitaxial structure 10 for a field-effect transistor in accordance to the present invention includes a semiconductive support 12, a quantum well 14 and a barrier layer 26. The quantum well 14 includes a first quantum well barrier layer 18, a channel layer 20, a second quantum well barrier layer 22. Preferably, the epitaxial structure 10 also includes a buffer layer 16. Most preferably, the epitaxial structure 10 further includes a separate donor layer 24.

The semiconductive support 12 including a substrate and/or a supporting layer made from a semiconductor material. For example, the semiconductive support 12 may be a substrate including InP or a supporting layer including InP.

The buffer layer 16 can include any material suitable for filtering dislocations from the semiconductive support 12 to minimize propagation into the active layers. The first and second quantum well barrier layers, 18 and 22, are made from any wide-bandgap semiconductor material with a large conduction discontinuity for confining electron flow in the channel layer 20. For example, the quantum well barrier layers 18 and 22 can include a material selected from the group comprising essentially of $AlP_{0.39+y}Sb_{0.61-y}$ and $AlIn_{0.48+z}As_{0.52-z}$. The actual value of z depends upon the application of the HEMT or pHEMT device. A preferred value of z is between about 0 and about 0.52. A more preferred value of z is between about 0 and 0.12.

The channel layer 20 is made of any narrow-bandgap semiconductor material suitable for high mobility electron transport. For example, the channel layer may be made of $Ga_{0.47-x}In_{0.53+x}As$. Like the composition of the quantum well barrier layers 18 and 22, the actual value of x depends upon the application of the HEMT and pHEMT device. A preferred value of x is between about 0 and about 0.47. A more preferred value of x is between about 0.12 and about 0.47.

The barrier layer 24 over the quantum well 14 is made of any wide-bandgap semiconductor material suitable for functioning as a Schottky gate. The preferred wide-bandgap semiconductor for the barrier layer 24 is $AlP_{0.39+y}Sb_{0.61-y}$. In one preferred embodiment of the present invention, the barrier 26 and donor 24 layers includes a material having the formula $AlP_{0.39+y}Sb_{0.61-y}$.

In a second preferred embodiment of the present invention, the epitaxial structure 10 includes a buffer layer 16 including a material having the formula $AlP_{0.39+y}Sb_{0.61-y}$. The more preferred epitaxial structure 10 includes buffer 16, donor 24 and barrier 26 layers all made of $AlP_{0.39+y}Sb_{0.61-y}$. The most preferred epitaxial structure 10 further includes two epilayers 18 and 22 made of $AlP_{0.39+y}Sb_{0.61-y}$. For those layers in the epitaxial structure 10 that include $AlP_{0.39+y}Sb_{0.61-y}$, y has a value between about 0 and about 0.39.

The growth of those layers comprising $AlP_{0.39+y}Sb_{0.61-y}$ (AlPSb layers) can be achieved by conventional epitaxial growth techniques which supply sources of phosphorous and antimony. For example, an AlPSb layer mad of $AlP_{0.39}Sb_{0.61}$ can be grown from a $PH_3$ gas source equipped with a solid-source antimony. In addition, such AlPSb layer can be grown from an AlP/AlSb superlattice to mimic an $AlP_{0.39}Sb_{0.61}$ layer. For example, such AlPSb can be grown in accordance with the superlattice growth method from a superlattice with a period of about 30 Å and a proper duty cycle, namely about 11.7 Å AlP and about 18.3 Å AlSb, which will mimic the electronic properties of $AlP_{0.39}Sb_{0.61}$. Preferably, the AlP/AlSb superlattice has a period measurement between about 15 Å and about 50 Å.

The more preferred method of growing the AlPSb layers is growth from a phosphine ($PH_3$) gas source, and solid-source of antimony. The flow of phosphine gas can be controlled with a mass flow controller. A thermal cracker at about 800° C. to about 1000° C. cracks phosphine gas into (mainly) dimers before incorporating into the growth front of the layers. As for the antimony, a well established approach is to generate tetramers and dimers of antimony by thermal means (in an effusion cell), in the same way arsenic is generated in a more conventional solid-source MBE growth chamber. High-quality antimonides (GaSb and AlSb) have been achieved worldwide with or without a thermal cracker. Yet, unlike the arsenic, antimony flux can be shuttered very abruptly. Thus, high quality, abrupt interfaces can be grown.

Conventional epitaxial growth processes can be used to make the epitaxial structure 10 of the present invention. The preferred processes include gas-source molecular beam epitaxy (GSMBE), chemical beam epitaxy (CBE), and metalorganic chemical vapor deposition (MOCVD), the latter process also known as metalorganic vapor phase epitaxy (MOVPE). The most preferred processes are GSMBE and CBE.

Figure 2:
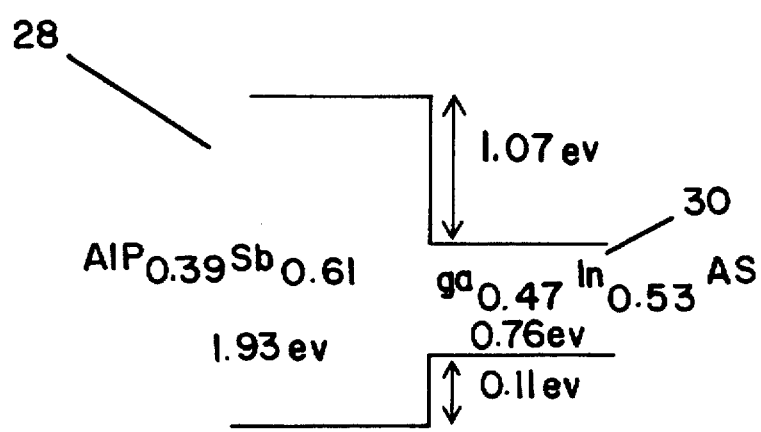
FIG. 2 is a schematic diagram of a bandgap lineup of a field-effect transistor structure embodying the present invention.

Calculations were performed based on the self-consistent ab initio band structure methodology of Van de Walle's model solid approach (reference: C. G. Van de Walle, "Band lineups and deformation potentials in the model-solid theory", Physical Review B, Vol. 39, pages 1871–1881, January 1989) on the material system $AlP_{0.39}Sb_{0.61}$ and $Ga_{0.47}In_{0.53}As$. FIG. 2 shows the band lineup between $AlP_{0.39}Sb_{0.61}$ 28 and $Ga_{0.47}In_{0.53}As$ 30, which are lattice matched to InP. Based on these calculations, a type I lineup can be expected between $AlP_{0.39}Sb_{0.61}/Ga_{0.47-x}In_{0.53+x}As$ (x between 0 and 0.47). In particular, a large $\Delta Ec$ from 1.07 eV (for $Ga_{0.47}In_{0.53}As$ 30) to 1.21 eV (for InAs) is expected in this material system. $AlP_{0.39}Sb_{0.61}$ 28 has a very wide bandgap of about 1.93 eV.

The epitaxial structure of the present invention results in a reliable device suitable for high-speed, low-noise applications because the large $\Delta Ec$ between AlPSb and GaInAs compared to the conventional $\Delta Ec$ between AlInAs and GaInAs translates into a larger sheet charge in the $Ga_{0.47-x}In_{0.53+x}As$ channel. In addition, the device provides a flexible framework for allowing the use of strain-compensation. One can add more indium to the channel (beyond the lattice-matched to InP mole fraction of 0.47 all the way to complete InAs) and at the same time add more P to the AlPSb barrier. The channel is then under a biaxial compressive stress while the barrier is under a biaxial tensile stress. Increasing the phosphorous content of the AlPSb barrier produces a compressive strain in the barrier to compensate for the tensile strain of the In-rich GaInAs channel. Thus one can improve the transport and breakdown/leakage characteristics and at the same time take care of the growth requirement of a pseudomorphic structure. Also, InAs channel can be inserted to take advantage of the high electron mobility. The high In mole fraction $Ga_{0.47-x}In_{0.53+x}As$ channel results in a high mobility and low-noise HEMT. Furthermore, the wide bandgap of the $AlP_{0.39+y}Sb_{0.61-y}$ results in a large Schottky barrier. Moreover, because AlP is a more chemically stable material than AlSb, the material $AlP_{0.39+y}Sb_{0.61-y}$ is expected to be chemically very stable compared to AlSb itself. Finally, with the large bandgap, $AlP_{0.39}Sb_{0.61}$ is an excellent candidate for a high-resistivity buffer layer.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. A method of making an epitaxial structure for a field-effect transistor, the steps comprising:
   providing a first quantum well barrier layer over a semiconductive support, said first quantum well barrier layer comprising a first wide-bandgap semiconductor material;
   providing a channel layer over the first quantum well barrier layer, said channel layer comprising a narrow-bandgap semiconductor material;
   providing a second quantum well barrier layer over the channel layer, said second quantum well barrier layer comprising a second wide-bandgap semiconductor material;
   providing a barrier layer over the second quantum well barrier layer, said donor layer comprising $AlP_{0.39+y}Sb_{0.61-y}$, wherein y has a value between about 0 and about 0.39.

2. The method of claim 1 further comprising providing a donor layer between the second quantum well barrier layer and the barrier layer, said donor layer comprising a third wide-bandgap semiconductor material.

3. The method of claim 1 wherein said narrow-bandgap semiconductor material is $Ga_{0.47-x}In_{0.53+x}As$, wherein x has a value between about 0 and about 0.47.

4. The method of claim 1 where in said first wide-bandgap semiconductor material and said second wide-bandgap semiconductor material are materials selected from the group consisting essentially of $AlIn_{0.48+z}As_{0.52-z}$ and $AlP_{0.39+y}Sb_{0.61-y}$, wherein z has a value between about 0 and about 0.52 and y has a value between about 0 and about 0.39.

5. The method of claim 1 wherein said semiconductive support comprises an InP substrate.

6. The method of claim 2 wherein the third wide-bandgap semiconductor material is $AlP_{0.39+y}Sb_{0.61-y}$, wherein y has a value between about 0 and about 0.39.

7. The method of claim 1 further comprising the step of providing a buffer layer between the first quantum well barrier layer and the semiconductive support, said buffer layer comprising a semiconductor material.

8. The method of claim 7 wherein said semiconductor material is $AlP_{0.39+y}Sb_{0.61-y}$, wherein y has a value between about 0 and about 0.39.

9. The method of claim 1 further comprising the step of doping the barrier layer.

10. The method of claim 2 further comprising the step of doping the donor layer.

11. The method of claim 1 wherein:
    said first quantum well barrier layer is provided over said semiconductive support by growing said first quantum well barrier layer over said semiconductive support in a growth chamber;
    said channel layer is provided over said first quantum well barrier layer by growing said channel layer over said first quantum well barrier layer in said growth chamber;
    said second quantum well barrier layer is provided over said channel layer by growing said second quantum well barrier layer over said channel layer in said growth chamber;
    said barrier layer is provided over said second quantum well barrier layer by growing said barrier layer over said second quantum well barrier layer in said growth chamber.

12. The method of claim 11 wherein said growth chamber is adapted for growth of epitaxial AlPSb from an AlP/AlSb superlattice.

13. The method of claim 11 wherein said growth chamber is adapted for growth of films from a phosphine gas source and a solid-source antimony.

14. A method of making an epitaxial structure for a field-effect transistor; the steps comprising:
    providing a buffer layer over a semiconductive support, said buffer layer comprising $AlP_{0.39+y}Sb_{0.61-y}$, wherein y has a value between about 0 and about 0.39;
    providing a first quantum well barrier layer over the buffer layer, said first quantum well barrier layer comprising a first wide-bandgap semiconductor material;
    providing a channel layer over the first quantum well barrier layer, said channel layer comprising a narrow-bandgap semiconductor material;
    providing a second quantum well barrier layer over the channel layer, said second quantum well barrier layer comprising a second wide-bandgap semiconductor material;
    providing a barrier layer over the second quantum well barrier layer, said donor layer comprising a wide-bandgap semiconductor material.

15. The method of claim 14 further comprising the step of providing a donor layer between the second quantum well barrier layer and the barrier layer, said donor layer comprising a third wide-bandgap semiconductor material.

* * * * *